United States Patent
Takahiko

(10) Patent No.: US 7,139,329 B2
(45) Date of Patent: Nov. 21, 2006

(54) RECEIVER IN A RADIO COMMUNICATION SYSTEM

(75) Inventor: Kishi Takahiko, Yokohama (JP)

(73) Assignee: Samsung Electronics Co., Ltd. (KR)

(*) Notice: Subject to any disclaimer, the term of this patent is extended or adjusted under 35 U.S.C. 154(b) by 734 days.

(21) Appl. No.: 09/956,695

(22) Filed: Sep. 20, 2001

(65) Prior Publication Data

US 2002/0051503 A1    May 2, 2002

(30) Foreign Application Priority Data

Sep. 21, 2000 (JP) ............................. 2000-287667

(51) Int. Cl.
*H04L 27/06* (2006.01)
(52) U.S. Cl. ............... 375/316; 375/327; 455/189.1
(58) Field of Classification Search ........... 375/329, 375/327, 332, 261, 326, 344, 346, 285, 319, 375/345, 366, 376, 375; 455/76, 313, 553, 455/86, 3.2, 304, 324, 209, 192.2, 552, 102, 455/180.1, 12.1, 13.1, 266, 307, 340, 703, 455/316, 180.3, 189.1; 708/271, 272; 713/600; 331/18, 25; 327/106; 275/316, 327, 375, 275/376

See application file for complete search history.

(56) References Cited

U.S. PATENT DOCUMENTS

| | | | |
|---|---|---|---|
| 5,003,621 A * | 3/1991 | Gailus | 455/209 |
| 5,555,453 A * | 9/1996 | Kajimoto et al. | 455/266 |
| 5,812,927 A * | 9/1998 | Ben-Efraim et al. | 725/70 |
| 5,859,570 A * | 1/1999 | Itoh et al. | 331/18 |
| 5,890,051 A * | 3/1999 | Schlang et al. | 455/76 |
| 5,960,364 A * | 9/1999 | Dent | 455/552.1 |
| 6,175,746 B1 * | 1/2001 | Nakayama et al. | 455/552.1 |
| 6,347,325 B1 * | 2/2002 | Ribner et al. | 708/271 |
| 6,356,603 B1 * | 3/2002 | Martin et al. | 375/345 |
| 6,370,211 B1 * | 4/2002 | Carsello | 375/346 |
| 6,519,305 B1 * | 2/2003 | Roth et al. | 375/376 |
| 6,539,411 B1 * | 3/2003 | Johnson | 708/271 |
| 6,608,869 B1 * | 8/2003 | Limberg | 375/261 |
| 6,693,980 B1 * | 2/2004 | Linder et al. | 375/329 |

OTHER PUBLICATIONS

Interpolation and decimation of digital signals-A tutorial review; Crochiere, R.E., Rabiner, L.R.;□□Proceedings of the IEEE□□vol. 69, Issue 3, Mar. 1981 pp. 300-331.*

A programmable power-efficient decimation filter for software radios; Farag, E.N.; Ran-Hong Yan; Elmasry, M.I.;□□Low Power Electronics and Design, 1997. Proceedings., 1997 International Symposium on□□Aug. 18-20, 1997 pp. 68-71 □□.*

(Continued)

*Primary Examiner*—Temesghen Ghebretinsae
(74) *Attorney, Agent, or Firm*—Dilworth and Barrese LLP

(57) ABSTRACT

A receiver has a low spurious level and a high frequency precision without increasing power consumption of a local oscillator. The receiver comprises first and second local oscillators; a phase locked loop operating based on an output of the first local oscillator; a first mixer for receiving an RF signal or an IF signal, and converting the received signal to a second IF signal according to an output signal of the phase locked loop; an analog-to-digital converter for converting an output signal of the first mixer to a digital signal; a second mixer for converting the digital signal to a detection process frequency according to an output of the second local oscillator; and a filter for bandpass filtering, interposed between the first mixer and the analog-to-digital converter or between the analog-to-digital converter and the second mixer.

16 Claims, 4 Drawing Sheets

OTHER PUBLICATIONS

Decimation and interpolation of narrow-band signals; Vainio, O.; Industrial Electronics Society, 1998. IECON '98. Proceedings of the 24th Annual Conference of the IEEE vol. 3, Aug. 31-Sep. 4, 1998 pp. 1362-1365 vol. 3.*

* cited by examiner

RECEIVER IN A RADIO COMMUNICATION SYSTEM

PRIORITY

This application claims priority to an application entitled "Receiver" filed in the Japanese Patent Office on Sep. 21, 2000 and assigned Ser. No. 2000-287667, the contents of which are hereby incorporated by reference.

BACKGROUND OF THE INVENTION

1. Field of the Invention

The present invention relates generally to a receiver in a radio communication system, and in particular, to a receiver for sampling an intermediate frequency (IF) signal and then performing digital signal processing on the sampled signal.

2. Description of the Related Art

A conventional receiver samples a received signal and performs digital signal processing on the sampled signal in an RF (Radio Frequency) unit or an IF unit, for signal selection or detection. A block diagram of the conventional receiver is illustrated in FIG. 4.

Referring to FIG. 4, a phase locked loop (PLL) 102 outputs a local signal depending on a reference signal, the reference signal being an output signal of a DSP (Digital Signal Processing)-based signal generator 103. A first set of mixers 101a and 101b convert a received RF signal to IF signals using the local signal. The IF signals, after being sampled into digital signals, are converted to baseband signals by digital signal processing in a second set of mixers 111a and 111b in a digital down-converter 110.

In the conventional receiver, a local oscillator, or a direct digital synthesizer (DDS), used for the first mixers 101a and 101b, generates spurious signals due to the inherent operation of a reference signal generator. Among the spurious signals, a spurious signal whose frequency is positioned apart from a local frequency is suppressed by the phase locked loop 102, but a spurious signal of which frequency is close to the local frequency is not suppressed, increasing interference to an adjacent channel.

Several attempts have been made to solve this problem, among them are (1) increasing an operation precision to decrease a level of the spurious signal from the DSP-based signal generator to a tolerable level, (2) adopting a dither technique to reduce a spurious peak level by spreading the spurious signal generated from the local oscillator used as the DSP-based signal generator, and (3) using a frequency where the spurious signal is not generated, based on the fact that generation of the spurious signal by the local oscillator depends upon an oscillation frequency of the local oscillator. Using the spurious-free frequency, a method for selecting a best combination out of combinations of frequency division and multiplication values of the phase locked loop and output frequencies of the local oscillator is typically used. However, it is known that a reduction in bandwidth of a DDS-driven phase locked loop such as the phase locked loop 102 desirably narrows a band where the spurious signals are not suppressed, but undesirably lowers a response speed of the phase locked loop.

However, the above listed attempts to reduce the spurious signal (1) cause an increase in circuit scale and power consumption, (2) also cause an increase in circuit scale and power consumption, though less than when the measurement of decreasing the spurious level has been taken, and a deterioration in a carrier-to-noise ratio (C/N), and (3) cause the restriction of available frequencies. In particular, if an output frequency of the DSP-based signal generator is increased in order to improve a response characteristic of the phase locked loop and a C/N characteristic, then a weight of the power consumption by a digital signal processor is undesirably increased.

SUMMARY OF THE INVENTION

It is, therefore, an object of the present invention to provide a receiver having a low spurious level and a high frequency precision without increasing power consumption of a DSP-based signal generator.

To achieve the above and other objects, there is provided a receiver comprising first and second local oscillators; a phase locked loop operation based on an output of the first local oscillator; a first mixer for receiving an RF (Radio Frequency) signal or an IF (Intermediate Frequency) signal, and converting the received signal to a second IF signal according to an output signal of the phase locked loop; an analog-to-digital converter for converting an output signal of the first mixer to a digital signal; a second mixer for converting the digital signal to a detection process frequency according to an output of the second local oscillator; and a filter for bandpass filtering, interposed between the first mixer and the analog-to-digital converter or between the analog-to-digital converter and the second mixer; wherein an oscillating frequency step of the first local oscillator is larger than an oscillating frequency step of the second local oscillator.

Preferably, the first and second local oscillators are each comprised of a direct digital synthesizer (DDS) that outputs a sine wave and a cosine wave.

Preferably, a phase operation word length of the direct digital synthesizer corresponding to the first local oscillator is identical to an input word length of a sine/cosine wave table for converting phase data to sine/cosine waves.

Preferably, the first local oscillator sequentially reads the sine/cosine wave table for converting the phase data to sine/cosine waves.

Preferably, a length of the sine/cosine wave table is variable.

Preferably, the sine/cosine wave table has data of a multiple period.

Preferably, the filter for bandpass filtering is interposed between the analog-to-digital converter and the second mixer, and the filter is a decimation filter for decreasing a sampling frequency.

Preferably, a bandwidth of the filter is equal to a communication channel bandwidth plus an output frequency step of the local oscillator.

Preferably, the filter is an FIR (Finite Impulse Response) filter, and for frequency setting of the digital down-converter, a BPF coefficient for the filter is calculated by multiplying $\cos(n\omega)$ by a coefficient of a reference lowpass filter having a half bandwidth of the communication channel bandwidth, wherein $\omega$ is a given intermediate frequency of the filter.

Preferably, the value $\cos(n\omega)$ multiplied by the coefficient of the reference lowpass filter is obtained using a digital local oscillator.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
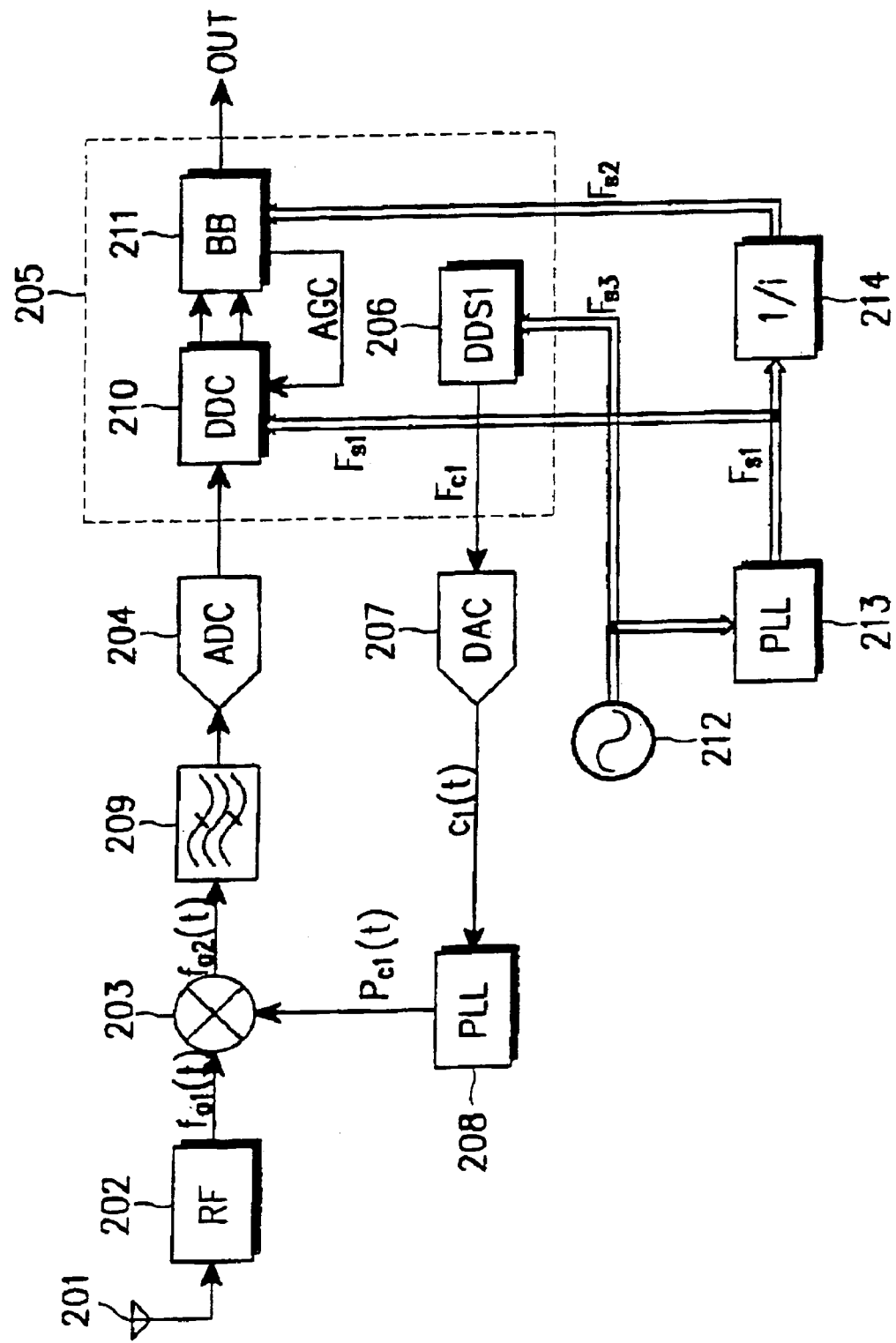
FIG. 1 is a block diagram illustrating a structure of a receiver according to an embodiment of the present invention.
Figure 2:
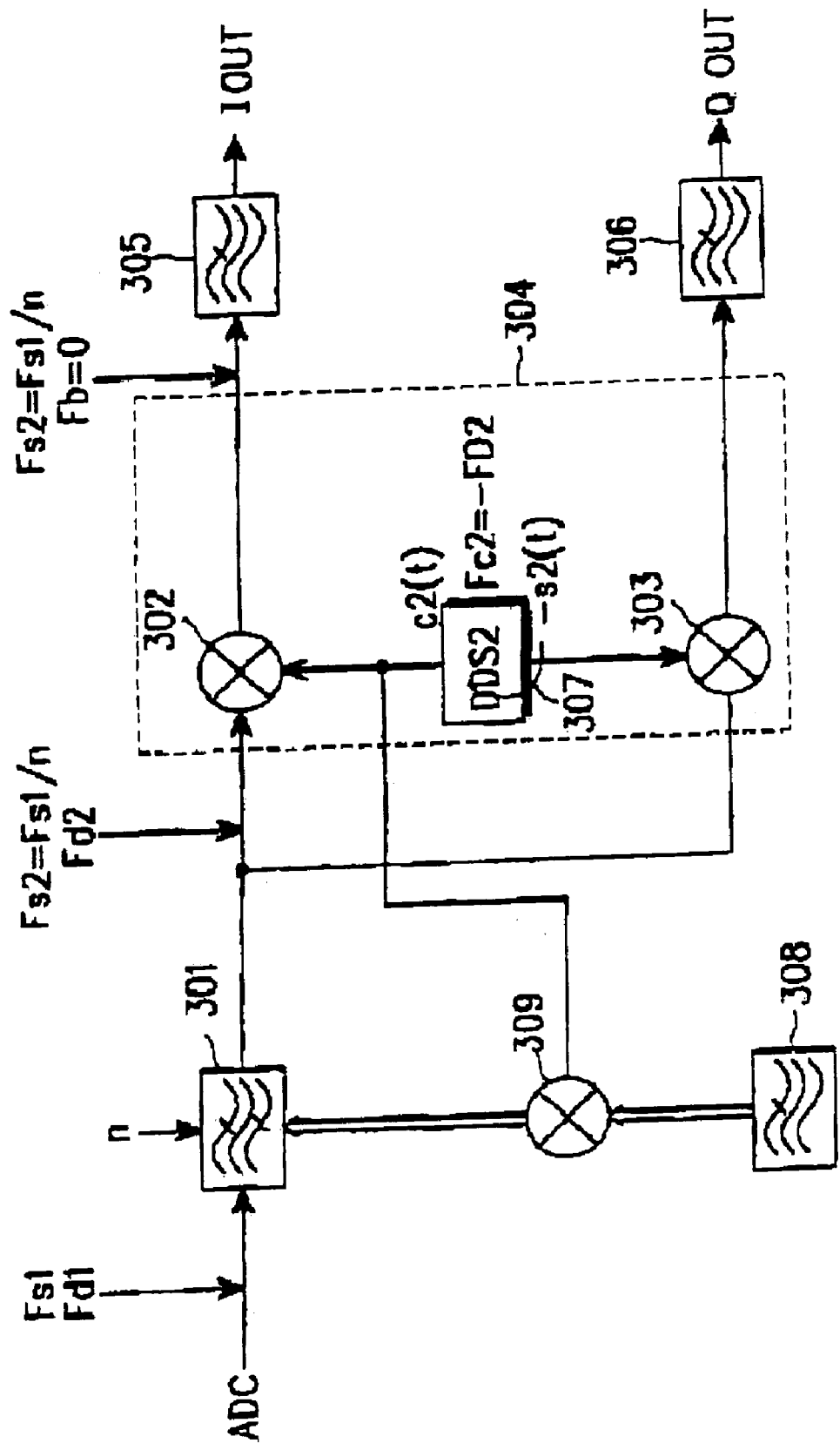
FIG. 2 a detailed block diagram illustrating a structure of the digital down-converter in the receiver according to an embodiment of the present invention.

FIG. 1 illustrates a receiver according to an embodiment of the present invention, and FIG. 2 illustrates a detailed structure of the digital down-converter (DDC) 210 shown in FIG. 1.

Referring to FIGS. 1 and 2, an input signal fa1(t) received through an antenna 201 is provided to a first mixer 203 through an RF unit 202. The first mixer 203 multiplies the input signal fa1(t) from the RF unit 202 by a local signal pc1(t) provided from a phase locked loop (PLL) 208 to convert the input signal fa1(t) to an IF signal fa2(t), and provides the converted IF signal fa2(t) to an analog-to-digital converter (ADC) 204 through a bandpass filter (BPF) 209. The local signal pc1(t) is an output signal of the phase locked loop 208, which converts a digital signal of a frequency Fc1, output from a first local oscillator (DDS1) 206 in a digital signal processor 205, to an analog signal through a digital-to-analog converter (DAC) 207, and operates using the converted analog signal as a reference signal c1(t). For the first local oscillator 206, a direct digital synthesizer (DDC) is typically used. That is, the input signal fa1(t) is converted to a first IF signal fa2(t) by the output frequency pc1(t) of the phase locked loop 208.

The first IF signal fa2(t) is provided to the analog-to-digital converter 204 through the bandpass filter 209. The analog-to-digital converter 204 converts the first IF signal fa2(t) to a digital signal fd1(t) by sampling it at a sampling frequency Fs1. The digital signal fd1(t) is provided to an FIR (Finite Impulse Response) filter 301 of FIG. 2, having a BPF characteristic, included in a digital down-converter 210 in the digital signal processor 205. The FIR filter 301 suppresses an undesired outband frequency component such as an aliasing frequency generated during down-sampling of the digital signal fa1(t) or fd1(t), and then, 1/n down-samples the resulting signal, thereby outputting a down-sampled signal having a sampling frequency Fs2. In FIG. 1, reference numeral 211 denotes a baseband circuit (BB) 211, reference numeral 212 denotes an oscillator (preferably, a crystal oscillator), reference numeral 213 denotes a phase locked loop (PLL) for locking (matching) a local signal to a reference signal, and reference numeral 214 denotes a 1/i frequency divider for creating a clock used by the baseband circuit 211.

In order to convert the digital signal from the analog-to-digital converter 204 to a frequency easy to down-convert, the digital down-converter 210 according to the present invention converts the IF signal fa2(t) output from the first mixer 203 to another IF signal by a second mixer 304 comprised of multipliers 302 and 303, and extracts only a desired inband IF signal from said another IF signal by bandpass filters 305 and 306 in the digital down-converter 210, for the down-sampling.

That is, the IF signal fd2(t) down-sampled with the sampling frequency Fs2 is complex-multiplied by the second mixer 304 by local oscillation signals c2(t) and −s2(t) of a frequency Fc2, provided from a second local oscillator (DDS2) 307, and thus, converted to signals fa3(t) of a baseband frequency Fb. The converted baseband signals fa3(t) are provided to the baseband circuit 211 of FIG. 1 through rolloff filters 305 and 306, respectively.

A coefficient of the FIR filter 301 is obtained by a multiplier 309 by multiplying a coefficient of a reference lowpass filter (LPF) 308 by a real component signal c2(t) of the second local oscillator (DDS2) 307 upon power up of the digital down-converter 210 or upon frequency setup (or channel setup) of the first local oscillator (DDS1) 206. As the multiplier 309 multiplies the coefficient of the reference lowpass filter 308 by complex signals c2(t) and −s2(t) output from the second local oscillator 307, the coefficient of the FIR filter 301 becomes a complex coefficient. Preferably, the FIR filter 301 is comprised of a polyphase filter in order to reduce operations.

Figure 3:
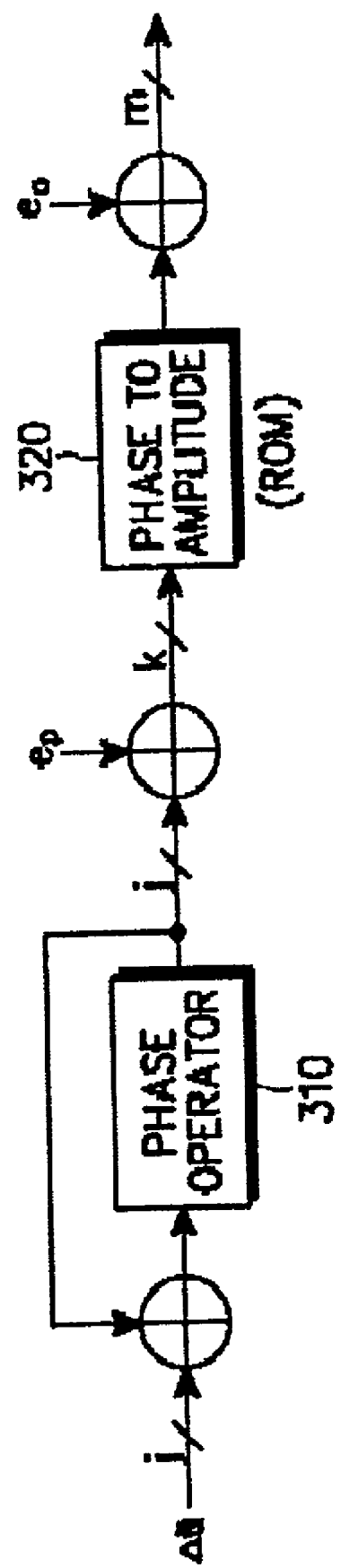
FIG. 3 is a block diagram for explaining a basic principle of the local oscillator according to an embodiment of the present invention.
Figure 4:
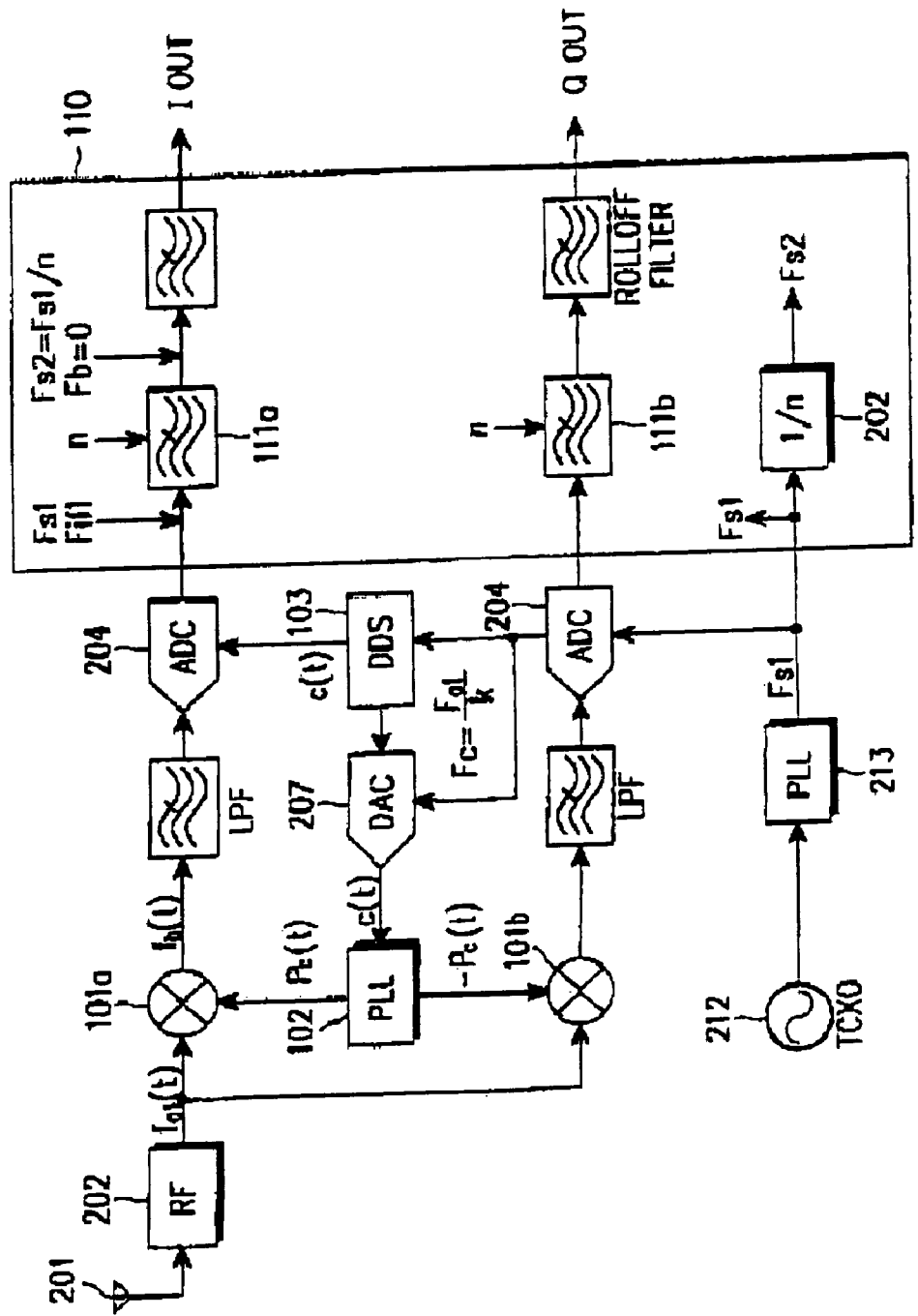
FIG. 4 is a block diagram illustrating a structure of a conventional receiver.

FIG. 3 illustrates a basic principle of the direct digital synthesizer (DDS) according to the present invention. Referring to FIG. 3, the direct digital synthesizer calculates a phase of a desired frequency by a phase operator 310 comprised of a j-bit width adder (not shown) receiving j-bit width frequency data $\Delta\Phi$ and a phase register (not shown). A clipping process is not performed even though the adder overflows. Subsequently, a j-bit width output of the phase operator 310 is converted to a k-bit width, a ROM address input width, before it is provided to a ROM 320 for converting the phase value to a sine wave. A requantization error generated during the conversion of the j-bit width to the k-bit width is compensated for by adding it to a phase error $e_p$. An amplitude value output from the ROM 320 in response to the k-bit width input value has an m-bit width, and in this case also, a quantization error occurs. The quantization error is also compensated for by adding it to an amplitude error $e_a$.

A level of the spurious signals generated from the first and second local oscillators 206 and 307 each comprised of the direct digital synthesizer shown in FIG. 3, is represented by the following logical formula. That is, a carrier-to-spurious ratio (C/S) caused by the phase error is calculated by Equation (1).

$$\left(\frac{C}{S}\right) = 2^k \operatorname{sinc}\left(\frac{GCD(\Delta\Phi, 2^{j-k})}{2^{j-k}}\right), \; GCD(\Delta\Phi, 2^j) < 2^{j-k} \quad (1)$$

where GCD(a,b) is the greatest common divisor (GCD) of 'a' and 'b', and if $GCD(\Delta\Phi, 2^j) \geq 2^{j-k}$, the phase error is $e_p = 0$.

Further, a carrier-to-spurious ratio (C/S) due to the amplitude error is calculated by Equation (2).

$$\left(\frac{C}{S}\right) = 10 \log_{10}\left(\frac{A^2}{2} \times \frac{12}{\Delta_A^2} \times \frac{P}{4}\right) = \left(1.76 + 6.02m + 10 \log_{10}\left(\frac{P}{4}\right)\right) dBc \quad (2)$$

where $$P = \frac{2^j}{GCD(\Delta\Phi, 2^j)},$$

and P denotes a repetition period of a phase accumulator.

The aforesaid formals are disclosed in a paper entitled "Spur reduction techniques in sine output direct digital synthesis", Proceedings of the IEEE International Frequency Control Symposium, 1996.

The present invention performs 2-step frequency conversion using the phase locked loop (PLL) 208 associated with the first local oscillator (DDS1) 206 having a rough frequency step and a low spurious level, and the second local oscillator (DDS2) 307 having a fine frequency step and a less than excellent spurious characteristic, thus providing a receiver having a desired frequency step without an increase in circuit scale and power consumption. For the first and second local oscillators 206 and 307 outputting the sine wave and the cosine wave, the direct digital synthesizer having an excellent spurious characteristic can be used. A CORDIC, a substitute of the direct digital synthesizer, cannot be simply applied to the present invention, because a reduction in operations causes an increase in spurious level. However, it is possible to use a direct digital synthesizer for the reference local oscillator (DDS1) 206 for the phase locked loop 208 and use a CORDIC for the second local oscillator 307. Here, the "CORDIC" refers to Coordinate Rotation Digital Computer, also known as a digital circuit for forming a trigonometrical function operation.

By sequentially reading a sine/cosine wave table, the first local oscillator 206 can operate under a condition that a spurious signal caused by the phase error is not generated. The sine/cosine wave table is stored in a ROM (Read Only Memory) in which table data is registered, or registers the table data in a RAM (Random Access Memory) upon power up.

The spurious characteristic caused by the phase error of the first local oscillator (DDS1) 206 is improved by 6.02 dB, every time a difference (i.e., requantization error) between input word lengths (address length=ROM size) of the phase operator 310 and the ROM 320 is decreased by 1 bit. If the phase operation word length is fixed, each time the address word length of the ROM 320 is increased by 1 bit to improve the spurious characteristic, the required ROM size is doubled and the power consumption is also nearly doubled.

The spurious characteristic caused by the output word length (ROM data length) of the direct digital synthesizer is improved by 6.02 dB, each time the output word length of the direct digital synthesizer is increased by 1 bit. Even though the ROM data length is increased by 1 bit, e.g., even though an 11-bit output is changed to a 12-bit output, a ratio of a circuit scale to an increase in power consumption is no more than 12/11=1.091 (=1.0+0.1/LSB), showing a great difference compared with the improvement of the spurious characteristic caused by the phase error.

Since the direct digital synthesizer according to the present invention has a rough output step, even though the phase operation word length is identical to the input word length of the ROM, it is possible to sufficiently reduce the ROM address length. In addition, the direct digital synthesizer having an excellent spurious improvement effect for an increase in the ROM size can determine a spurious level by determining the output word length, making it possible to realize a low spurious level. That is, it is possible to use the first local oscillator 206 under a condition that a spurious signal caused by the phase error is not generated.

Therefore, when the phase operation word length of the direct digital synthesizer is identical to the input word length of the ROM, the spurious level depends on only the output word length of the direct digital synthesizer. In addition, even in the case where the phase operation word length of the direct digital synthesizer is larger than the input word length of the ROM, if a rounding-off error to the input word length of the ROM is not generated by setting the oscillation frequency, the spurious level depends on only the output word length of the direct digital synthesizer. Based on this, if the first local oscillator 206 uses the table reading technique (table lookup technique) as a means of simplifying the circuit, the spurious level depends on only the output word length (ROM data bit length) of the ROM, used for the table, like the direct digital synthesizer having no phase error. Here, the "table reading technique" refers to a technique of sequentially reading the sine/cosine wave table to output sine/cosine waves having no spurious signal caused by the phase error of the direct digital synthesizer.

If a length of the sine/cosine wave table is represented by N and a multiplication ratio of the first local oscillator 206 by the phase locked loop 208 is represented by k, the output frequency becomes fout=fs*k/N. Further, by properly selecting a combination of the output frequency Fc1 of the first local oscillator 206 and the multiplication ratio k, it is possible to minimize a frequency error in the first mixer 203.

In addition, by varying a length of the sine/cosine wave table, it is possible to vary the length in a step of the output frequency of fout=fs*k/3, fs*k/4, fs*k/5, . . . Further, by registering data in a length=N table for a period M, the output frequency becomes fout=fs*(M+k/N). For example, the variation is available in the step of fout=fs*7k/16, fs*6k/16, fs*5k/16, fs*4k/16. Here, if N is fixed, it is possible to set the output frequency in a regular-interval step, like the direct digital synthesizer.

Meanwhile, the invention arranges the filter 301 for bandpass filtering between the analog-to-digital converter 204 and the second mixer 302, and uses the filter 301 as a decimation filter for down-sampling. That is, by decreasing a sampling frequency of the signal applied to the second mixer 304 in the digital down-converter 210, it is possible to decrease a sampling frequency (operating frequency) of the mixer and local oscillator in the next stage. Accordingly, even the same operation as the first local oscillator 206 is performed, the power consumption is decreased in proportion to the decrease in the sampling frequency. In addition, the output frequency step also becomes fine in proportion to the decrease in the sampling frequency. In other words, the frequency error can be reduced, even if an oscillator having the same structure as that of the first local oscillator 206 is used.

In the phase locked loop 208 driven by the first local oscillator 206, it is possible to avoid the interference caused by an undesired signal which is generated inside the band when the spurious signal from the first local oscillator 206 is multiplied by the adjacent channel or the outband spurious signal. Here, because of the operation of the phase locked loop 208, the spurious signal being apart from the local frequency can be reduced. Even though only a desired channel is passed by matching a bandwidth of the decimation filter 209 to the channel bandwidth and the output of the second local oscillator 307 tolerates the spurious signal, a signal-to-noise ratio (C/N) and a constellation are deteriorated, and the interference due to the undesired signal cannot be avoided. It is ideal that a bandwidth of the filter 209 should be identical to the channel bandwidth. However, since the first local oscillator 206 has the rough output frequency step, every received channel deviates from the center frequency of the IF frequency, generating an error. Therefore, a bandwidth of the filter is determined by spreading the center frequency band upward and downward, respectively, by ½ the output frequency step of the first local oscillator 206.

In addition, if $\cos(n\omega)$ is multiplied by an FIR filter coefficient of an LPF characteristic having a half bandwidth of the channel bandwidth, the filter band is shifted by $\omega$, obtaining a bandpass filter (BPF) having twice the bandwidth of the LPF, i.e., the channel bandwidth. By utilizing this as a down-sampling filter in the digital down-converter 210, it is possible to obtain the results of passing only the desired channel signal and suppressing generation of aliasing due to the down-sampling. Here, the frequency shift step is determined by an available step of a complex signal generator used for frequency sifting. It is also possible to obtain a filter deviating from the center frequency by an offset caused by the first local oscillator 206, for every channel. In this case, it is not necessary to add a frequency error of the first local oscillator 206 to a bandwidth of the bandpass filter.

When a suppression band attenuation of the filter is not enough to prevent aliasing due to the down-sampling, it is preferable to use a decimation filter for a filter obtained by cascading real coefficient filters having a large attenuation at a point where aliasing occurs during the down-sampling.

In addition, if the first mixer 203 is a quadrature converter and the digital down-converter (DDC) 210 receives a complex input signal, the FIR filter becomes a complex coefficient-complex FIR filter. In addition, if the analog mixer is a real mixer and the digital down-converter 210 performs real sampling, i.e., if the FIR filter is a real coefficient FIR filter (real coefficient real/complex BPF), it is possible to obtain a complex BPF coefficient for a real coefficient FIR filter by multiplying $\cos(n\omega)$ by a coefficient of the reference lowpass filter 308. In addition, if the analog mixer is a complex mixer and the digital down-converter performs complex sampling, i.e., if the FIR filter is a complex coefficient FIR filter (complex coefficient real/complex BPF), it is possible to obtain a complex BPF coefficient for the complex coefficient FIR filter by multiplying $e^{j(n\omega)}$ by a coefficient of the reference lowpass filter 308. The "real/complex BPF" refers to a BPF having a real/complex coefficient and a real/complex signal path.

Even by using the local oscillator for $\cos(n\omega)$ multiplied by the coefficient of the reference LPF, it is possible to obtain a complex BPF coefficient for the real coefficient FIR filter. Similarly, even by using the local oscillator for $e^{j(n\omega)}$ multiplied by the coefficient of the reference LPF, it is possible to obtain a complex BPF coefficient for the complex coefficient FIR filter. The reference LPF 308 can be comprised of a complex BPF. In this case, however, since multiplication for filter band shifting is subjected to complex operation, 4 new multipliers are added, so that 2 adders are required.

In order to calculate an excellent carrier-to-noise ratio (C/N) characteristic for the output of the local oscillator, the reference signal of the phase locked loop requires a high degree of signal purity. A sampling frequency of the digital down-converter 210 is required to be as high as tens of MHz, and is also required to be a multiple of a symbol/chip rate of the received signal, so that a phase locked loop or a binary rate multiplier is used for generation of a sampling clock. These methods cannot avoid deterioration in the carrier-to-noise ratio (C/N) of the clock, so that the temperature compensated crystal oscillator (TCXO) is used as the oscillator 212, for the sampling clock of the first local oscillator 206.

When there coexist an analog filter and a digital filter between the first mixer 203 and the second mixer 304 in the digital down-converter 210, the analog filter sets a communication channel bandwidth for a reduction in aliasing or a load due to an undesired signal to the analog-to-digital converter 204 to be wider than a step added to the output frequency step of the first local oscillator 206. For the digital filter, if the desired channel deviates from the center frequency by an offset by the first local oscillator 206, the deviation of the IF signal from the center frequency of the generated IF signal is absorbed, because of the rough output frequency step of the first local oscillator. As a result, it is not necessary to widen the communication channel bandwidth of the digital filter.

As described above, the present invention arranges the filter for bandpass filtering between the first mixer and the analog-to-digital converter or between the analog-to-digital converter and the second mixer, and sets an oscillation frequency step of the first local oscillator to be higher than an oscillable oscillation frequency step of the second local oscillator, contributing to a reduction in circuit size and power consumption, especially power consumption of the local oscillator. As a result, it is possible to provide a receiver having a low spurious level, a high frequency conversion precision, and low carrier-to-noise ratio (C/N) degradation.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A receiver comprising:

first and second local oscillators;

a phase locked loop operating on an output of the first local oscillator;

a first mixer for receiving one of an RF (Radio Frequency) signal and an IF (Intermediate Frequency) signal, and converting the received signal to a second IF signal according to an output signal of the phase locked loop;

an analog-to-digital converter for converting an output signal of the first mixer to a digital signal;

a second mixer for converting the digital signal to a detection process frequency according to an output of the second local oscillator; and a filter for bandpass filtering, interposed between one of (i) the first mixer and the analog-to-digital converter and (ii) the analog-to-digital converter and the second mixer;

wherein an oscillation frequency step of the first local oscillator is larger than an oscillation frequency step of the second local oscillator, wherein the first and second local oscillators are each comprised of a direct digital synthesizer (DDS) outputting a sine wave and a cosine wave, and wherein a phase operation word length of the direct digital synthesizer corresponding to the first local oscillator is identical to an input word length of a sine/cosine wave table for converting phase data to sine/cosine waves.

2. The receiver as claimed in claim 1, wherein the first local oscillator sequentially reads the sine/cosine wave table for converting the phase data to sine/cosine waves.

3. The receiver as claimed in claim 2, wherein the sine/cosine wave table has data of a multiple period.

4. The receiver as claimed in claim 2, wherein a length of the sine/cosine wave table is variable.

5. The receiver as claimed in claim 4, wherein the sine/cosine wave table has data of a multiple period.

6. The receiver as claimed in claim 1, wherein a bandwidth of the filter is equal to a communication channel bandwidth plus an output frequency step of the local oscillator.

7. The receiver as claimed in claim 6, wherein the filter is an FIR (Finite Impulse Response) filter, and for frequency setting of a digital down-converter, a BPF coefficient for the filter is calculated by multiplying $\cos(n\omega)$ by a coefficient of a reference lowpass filter having a half bandwidth of the communication channel bandwidth, wherein $\omega$ is a given intermediate frequency of the filter.

8. The receiver as claimed in claim 7, wherein the value $\cos(n\omega)$ multiplied by the coefficient of the reference lowpass filter is obtained using a digital local oscillator.

9. The receiver as claimed in claim 6, wherein the filter is an FIR filter, and for frequency setting of a digital down-converter, $e^{j(n\omega)}$ is multiplied by a coefficient of a reference lowpass filter having a half bandwidth of the communication channel bandwidth, wherein $\omega$ is a given intermediate frequency of the filter.

10. The receiver as claimed in claim 9, wherein the value $e^{j(n\omega)}$ multiplied by the coefficient of the reference lowpass filter is obtained using a digital local oscillator.

11. The receiver as claimed in claim 1, further comprising a temperature compensated crystal oscillator (TCXO) for generating a sample clock of the first local oscillator.

12. The receiver as claimed in claim 1, wherein the filter for bandpass filtering is interposed between the analog-to-digital converter and the second mixer, and wherein the filter is a decimation filter for decreasing a sampling frequency.

13. A receiver comprising:
first and second local oscillator;
a phase locked loop operating on a first frequency step of the first local oscillator;
a first mixer for converting a received RF signal to an IF signal according to a local oscillation signal from the phase locked loop;
an analog-to-digital converter for converting an output signal of the first mixer to a digital signal;
a filter for suppressing an undesired outband signal of the digital signal from the analog-to-digital converter; and
a second mixer for converting an output of the filter to a detection process frequency based on a second frequency step of the second local oscillator, wherein the first frequency step is larger than the second frequency step,
wherein the first and second local oscillators each are comprised of a direct digital synthesizer, and
wherein the first local oscillator is a direct digital synthesizer and the second local oscillator is a coordinate rotation digital computer (CORDIC).

14. The receiver as claimed in claim 13, wherein the filter is a decimation filter for decreasing a sampling frequency.

15. A receiver comprising:
first and second local oscillators;
a phase locked loop operating on an output of the first local oscillator;
a first mixer for receiving one of an RF (Radio Frequency) signal and an IF (Intermediate Frequency) signal, and converting the received signal to a second IF signal according to an output signal of the phase locked loop;
an analog-to-digital converter for converting an output signal of the first mixer to a digital signal;
a second mixer for converting the digital signal to a detection process frequency according to an output of the second local oscillator; and
a filter for bandpass filtering, interposed between one of (i) the first mixer and the analog-to-digital converter and (ii) the analog-to-digital converter and the second mixer;
wherein an oscillation frequency step of the first local oscillator is larger than an oscillation frequency step of the second local oscillator
wherein the first and second local oscillators are each comprised of a direct digital synthesizer (DDS),
wherein a bandwidth of the filter is equal to a communication channel bandwidth plus an output frequency step of the local oscillator, and
wherein the filter is an FIR filter, and for frequency setting of a digital down-converter, $e^{j(n\omega)}$ is multiplied by a coefficient of a reference lowpass filter having a half bandwidth of the communication channel bandwidth, wherein $\omega$ is a given intermediate frequency of the filter.

16. The receiver as claimed in claim 15, wherein the value $e^{j(n\omega)}$ multiplied by the coefficient of the reference lowpass filter is obtained using a digital local oscillator.

* * * * *